United States Patent [19]

McKinnon et al.

[11] 3,792,525

[45] Feb. 19, 1974

[54] METHOD OF MAKING A SEMICONDUCTIVE SIGNAL TRANSLATING DEVICE

[75] Inventors: Matthew C. McKinnon, Warren; Bernard A. MacIver, Lathrup Village, both of Mich.

[73] Assignee: General Motors Corporation, Detroit, Mich.

[22] Filed: May 3, 1973

[21] Appl. No.: 356,823

Related U.S. Application Data

[62] Division of Ser. No. 168,847, Aug. 4, 1971, Pat. No. 3,764,507, Division of Ser. No. 844,817, July 25, 1969.

[52] U.S. Cl. .................................. 29/588, 204/192

[51] Int. Cl. .................................. B01j 17/00

[58] Field of Search .................. 29/588; 204/192

[56] References Cited

UNITED STATES PATENTS

| | | | |
|---|---|---|---|
| 3,072,832 | 1/1963 | Kilby | 29/588 |
| 3,395,091 | 7/1968 | Sinclair | 204/192 |
| 3,416,224 | 12/1968 | Armstrong | 29/588 |
| 3,431,637 | 3/1969 | Caracciolo | 29/588 |

*Primary Examiner*—Roy Lake
*Assistant Examiner*—W. C. Tupman
*Attorney, Agent, or Firm*—Robert J. Wallace

[57] ABSTRACT

An improved substrate material for semiconductor devices and methods for making same. The substrate includes a refractory like supporting layer coated with a high purity layer of reactively sputtered insulating material onto which a very high purity semiconductive layer is deposited. One device proposed for this substrate material is a diode assembly having an alumina substrate with a reactively sputtered layer of alumina on a major surface. A layer of P-type semiconductive material deposited on the sputtered layer and a P-N junction established in the layer.

1 Claim, 6 Drawing Figures

METHOD OF MAKING A SEMICONDUCTIVE SIGNAL TRANSLATING DEVICE

RELATED PATENT APPLICATIONS

This application is a division of U.S. Pat. application Ser. No. 168,847 entitled "Method of Making Semiconductor Layers on Alumina Layers," filed Aug. 4, 1971, in the names of Matthew C. McKinnon and Bernard A. MacIver, now U.S. Pat. No. 3,764,507 and assigned to the assignee of this application. U.S. Ser. No. 168,847 is a division of U.S. Pat. application Ser. No. 844,817 entitled "Substrate Coating Method," filed July 25, 1969, in the names of Matthew C. McKinnon and Bernard A. MacIver, and assigned to the assignee of this application.

BACKGROUND OF THE INVENTION

This invention relates to semiconductor devices and more particularly to substrate material used therein.

Substrate materials used in semiconductor device fabrication are generally required to have properties which include a low thermal expansion coefficient, a high thermal conductivity, good electrical insulating characteristics and good chemical stability. Alumina is a commonly used substrate material and generally possesses these properties as set forth.

One of the problems often associated with alumina type material, however, is its surface roughness which can be on the order of 10,000 angstroms rms. Another problem often associated with the use of alumina as a substrate material has been its relative purity. If one desires to deposit a very high purity semiconductor layer uniformly onto a substrate material, it is particularly important that the deposition surface be uniform, clean and relatively free of impurities.

Heretofore, a common method of obtaining a suitable alumina surface for the deposition of semiconductor materials has been to lap, grind, polish, and clean it. The grinding and polishing steps however generally do a large amount of surface damage. This damage is generally not completely removable by chemical etching. Furthermore, polishing can introduce grit like particles into the surface of the alumina which further contaminates it. These impurities on or adjacent the deposition surface can migrate from the substrate into the subsequently applied semiconductor material, thereby contaminating it.

It is an object of this invention to provide a method for making a semiconductor device involving use of an improved substrate material.

BRIEF DESCRIPTION OF THE DRAWINGS

Other objects, features and advantages of this invention will become more apparent from the following description of preferred embodiments thereof and from the drawings, in which.

DESCRIPTION OF THE PREFERRED EMBODIMENT

Figure 3:
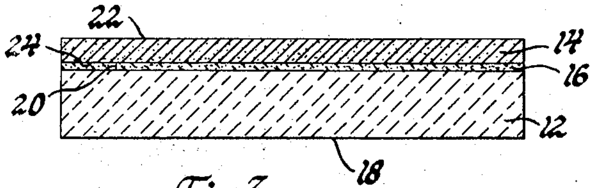

Turning now to the Figures, attention is directed to FIG. 3 which illustrates a substrate material made in accordance with the invention. This substrate material is used to make diode assembly 10 shown in FIG. 6. FIG.

3 shows diagrammatically a refractory substrate wafer 12 of alumina spaced from a P-type layer 14 of silicon by an electrically insulating layer 16 of high purity reactively sputtered alumina. Layer 16 is about 20,000A thick. Wafer 12 has major surfaces 18 and 20, surface 20 being contiguous and coextensive with layer 16. Layer 14 which is deposited onto layer 16 has major surfaces 22 and 24, surface 24 also being contiguous and coextensive with layer 16.

High purity layer 16 which is at least 99.999% $Al_2O_3$ substantially prevents impurities which may exist on or adjacent wafer surface 20 from contaminating semiconductor layer 14. These impurities normally present within a substrate wafer such as wafer 12 would tend to migrate into layer 16 by diffusion or other means. Furthermore, reactively sputtered layer 16 generally provides a more level surface for the deposition thereon of semiconductor layer 14 than a substrate such as wafer 12 would. The resultant substrate material of wafer 12 and layer 16 is an important aspect of this invention.

Figures 4, 5:
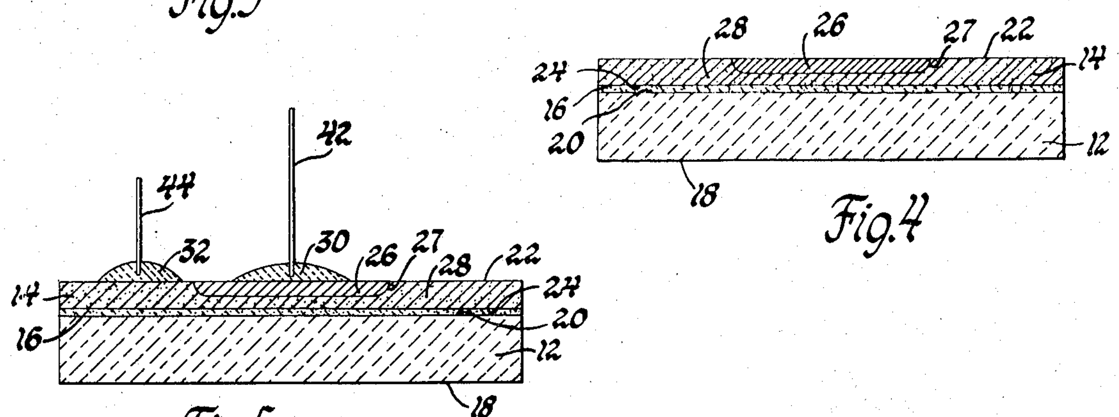

Referring now primarily to FIGS. 4 and 5 which shows an N-type conductivity diffused cathode region 26 within layer 14 and which extends to surface 22. A P-N junction 27 thus exists at the interface of layer 14 and region 26. Region 26 is spaced from layer 16 and from the periphery of surface 22 by layer 14. The P-type region of layer 14 constitutes anode region 28 of diode assembly 10. Copper contacts 30 and 32 are ohmically soldered to cathode region 26 and anode region 28 respectively on surface 22 in a conventional manner.

Figure 6:
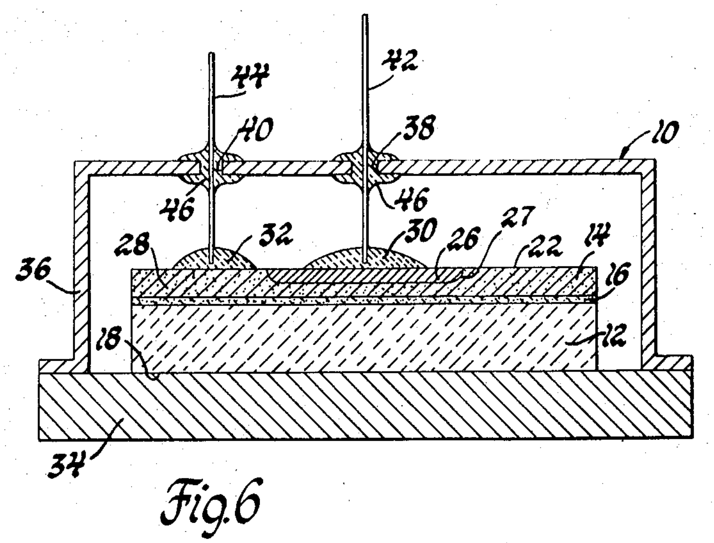
FIG. 6 is a cross-sectional view of a semiconductor device made in accordance with this invention.

Referring now primarily to FIG. 6 which shows surface 18 of wafer 12 solder bonded to a steel base member 34. A copper cover member 36 is braze bonded to member 34 and cooperates therewith to substantially encapsulate wafer 12 and semiconductor layer 14. The foregoing recited braze and solder bonds were performed in a conventional and well known manner. A pair of openings 38 and 40 in member 36 permit rod like copper connectors to electrically communicate with ohmic contacts 30 and 32 and provide external terminals. Connectors 42 and 44 are each spaced from member 36 by fused glass insulators 46 within openings 38 and 40.

Figure 1:
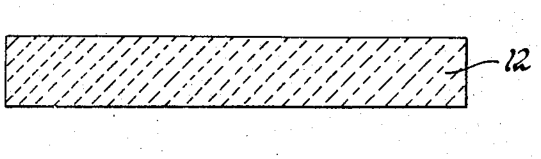
FIG. 1 through FIG. 5 inclusively depict steps in the fabrication of this preferred embodiment.
Figure 2:
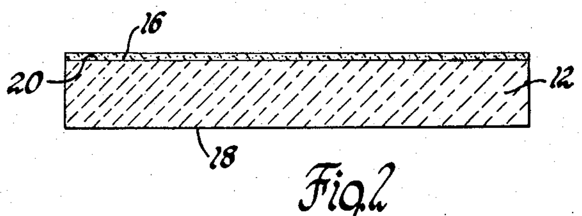

Aluminum oxide layer 16 can be reactively sputtered in any convenient manner, so long as it produces a layer of high purity, at least 99.999% $Al_2O_3$, aluminum oxide. For example, reactive sputtering techniques as set forth in "Phase Changes in Thin Reactively Sputtered Alumina Films," Journal of the Electrochemical Society, April, 1966, Vol. 113, No. 4 by R. G. Frieser can be used. An alumina wafer 12 as depicted in FIG. 1 is first thoroughly cleaned by etching, washing and rinsing.

After cleaning, the substrate wafer is placed on the anode of a conventional sputtering chamber. The chamber is closed, evacuated, purged and backfilled with oxygen to a pressure of about 200 microns of mercury. The active face of the cathode in the chamber is of high purity, at least 99.999% aluminum which is spaced about 3 centimeters from the anode. A potential difference of about 2,500 volts is established between the anode and cathode, with the current density being about 5 $ma/cm^2$. The sputtering is then accomplished at a rate of about 30 angstroms per minute for about 11 hours to form a layer about 20,000 angstroms thick.

Layer 14 can be pyrolytically deposited onto layer 16 of the resultant substrate material also in the known and accepted manner. By pyrolytic deposition we merely mean any deposition process that involves heat. For example, under a pressure of about 100 mm of mercury, the substrate 12 with layer 16 on it is heated to a temperature of about 700° C. The silicon deposition upon the surface 18 is then made by hydrogen reduction of a silicon halide, such as $SiI_4$, transported by argon gas into a deposition chamber. Diborane is then concurrently introduced into the chamber in the rate of approximately 150 parts per million of the $SiI_4$ vapor to give a P-type conductivity to the epitaxially deposited layer.

N-type region 26 can be formed within layer 14 by diffusion using the usual oxide masking techniques. These techniques include forming a protective coating of silicon oxide over surface 22, etching through this coating overlying a preselected region thereby exposing surface 22. N-type impurities can then be deposited on this preselected region and driven into layer 14 in a conventional diffusion furnace at a temperature of about 1,150° C. This protective coating can then be removed and contacts 30 and 32 ohmically bonded to surface 22.

It should be understood that although the preferred embodiment herein described employed an alumina wafer as the substrate for the reactively sputtered alumina layer, other refractory type materials having similar characteristics as set forth in the foregoing may be used. For example, a quartz substrate wafer may be used to substantially achieve the benefits of this invention; however, an alumina wafer is preferred.

It should also be understood that although the sputtered layer herein described is a high purity reactively sputtered alumina layer, reactively sputtered insulating layers of other materials such as silicon nitride, silicon oxide, or tantalum oxide may also be used. However, a reactively sputtered layer of alumina is preferred.

It should further be understood that although the sputtered alumina layer in the preferred embodiment has been described as being 20,000 angstroms, a layer thickness of only about 1,000 angstroms can be useful in some applications. However, a layer thickness of at least about 14,000 angstroms is preferred for most applications. A still larger thickness of about 20,000 angstroms, however, will insure that one attains a continuous coating or layer over even large surface roughness sometimes present in a substrate wafer.

It should still further be understood that although the preferred embodiment herein described is a diode, other semiconductive signal translating devices can be fabricated using the aforesaid described inventive concepts. For example, the P-type silicon layer could serve as the starting material from which a monolithic integrated circuit can be made. Moreover, this layer may be N-type and the diffusion region P-type. The layer may also be deposited in any suitable manner, for example, the known and accepted evaporation techniques may be used. Also, other semiconductive materials such as germanium may constitute the layer.

Although the invention has been described in regard to the specific example thereof, no limitation is intended thereby except as defined in the appended claims.

We claim:

1. A method for making a semiconductive signal translating device which comprises:

preparing a major surface of an alumina substrate wafer to receive a high purity layer of insulating material;

reactively sputtering a high purity coating of alumina to a thickness of at least about 1,000 angstroms onto said major surface to provide an extremely pure composite substrate on which to deposit even thin layers of a semiconductor;

depositing a layer of a semiconductor selected from the group consisting of germanium and silicon onto said coating of alumina, said semiconductor layer being of one conductivity type;

diffusing at least one impurity of opposite conductivity type into said semiconductor layer to form a P-N junction which intersects an exposed surface of said semiconductor layer between two areas of opposite conductivity type;

attaching ohmic contacts to each of said areas of opposite conductivity type;

enclosing said substrate, said areas and said ohmic contacts; and attaching terminal leads to said ohmic contacts for low resistance electrical connection of external circuitry to said enclosed areas.

* * * * *